US006080498A

United States Patent [19]

Kikui et al.

[11] Patent Number: 6,080,498

[45] Date of Patent: Jun. 27, 2000

[54] PERMANENT MAGNET FOR ULTRA-HIGH VACUUM AND PRODUCTION PROCESS THEREOF

[75] Inventors: Fumiaki Kikui, Osaka; Masako Ikegami, Amagasaki; Kohshi Yosimura, Osaka, all of Japan

[73] Assignee: Sumitomo Special Metals Co., Ltd., Osaka, Japan

[21] Appl. No.: 08/875,768

[22] PCT Filed: Dec. 20, 1996

[86] PCT No.: PCT/JP96/03717

§ 371 Date: Aug. 5, 1997

§ 102(e) Date: Aug. 5, 1997

[87] PCT Pub. No.: WO97/23884

PCT Pub. Date: Jul. 3, 1997

[30] Foreign Application Priority Data

| | | | |
|---|---|---|---|
| Dec. 25, 1995 | [JP] | Japan | 7-354671 |
| Sep. 6, 1996 | [JP] | Japan | 8-257698 |
| Sep. 26, 1996 | [JP] | Japan | 8-277201 |
| Oct. 1, 1996 | [JP] | Japan | 8-281542 |

[51] Int. Cl.[7] .......................... C23C 14/02; B32B 15/01; B32B 15/04; B32B 15/18

[52] U.S. Cl. ...................... 428/651; 204/192.1; 427/328; 427/127; 427/405; 428/660; 428/681; 428/332; 428/693; 428/699; 428/704

[58] Field of Search .................................... 428/627, 628, 428/651.65, 653, 660, 681, 692, 693, 698, 699, 704, 615, 332; 427/327, 328, 127, 404, 405, 419.7, 250, 299; 204/192.1, 192.32; 205/80

[56] References Cited

U.S. PATENT DOCUMENTS

| | | | |
|---|---|---|---|
| 5,316,595 | 5/1994 | Hamada et al. | 148/302 |
| 5,788,493 | 8/1998 | Tanaka et al. | 433/189 |

FOREIGN PATENT DOCUMENTS

| | | |
|---|---|---|
| 6-349619 | 12/1994 | Japan . |
| 7-249509 | 9/1995 | Japan . |
| 7-283017 | 10/1995 | Japan . |

*Primary Examiner*—Deborah Jones
*Assistant Examiner*—Michael LaVilla
*Attorney, Agent, or Firm*—Watson Cole Grindle Watson, P.L.L.C.

[57] ABSTRACT

A permanent magnet useful in an ultra-high vacuum atmosphere, such as an undulator requiring the ultra-high vacuum atmosphere of less than $1\times10^{-9}$ Pa and which, has excellent magnetic characteristics, includes an R-Fe-B system permanent magnet having a Ti undercoat layer on a surface thereof, an external layer selected from TiN, AlN and $Ti_{1-x}Al_xN$ (x is 0.03 to 0.70), and an Al intermediate layer therebetween.

13 Claims, 5 Drawing Sheets

PERMANENT MAGNET FOR ULTRA-HIGH VACUUM AND PRODUCTION PROCESS THEREOF

This application is a U.S. national phase of PCT/JP96/03717, filed Dec. 20, 1996.

TECHNICAL FIELD

The present invention relates to a permanent magnet usable for an ultra-high vacuum atmosphere, which possesses an excellent adherency of a film layer coated thereon and good magnetic characteristics, and is applicable to an undulator or a similar device commonly employed in ultra-high vacuum atmosphere. More specifically the invention relates to a permanent magnet used in ultra-high vacuum and the production process of the permanent magnet; the permanent magnet having excellent magnetic properties.

BACKGROUND ART

A novel permanent magnet of R(referring at least one element of rare-earth elements)-Fe-B system has been proposed (in Japan Patent Application Laid-Open No. Sho 59-46008, and Japan Patent Application Laid-Open No. Sho 59-89401), which is made of mainly rare-earth elements rich in Nd or Pr and B and Fe (eventually, therefore, the R-Fe-B system magnet does not contain expensive elements such as Sm or Co) and has superior magnetic characteristics to those found in the conventional type of rare-earth cobalt magnets.

Although the Curie point of the aforementioned magnet alloy is reported, in general, to be in a temperature range from 300° C. to 370° C., the Curie point of the R-Fe-B system permanent magnet (Japan Patent Application Laid-Open No. Sho 59-64733 and Japan Patent Application Laid-Open No. Sho 59-132104) was improved to be higher than that reported for the conventional type magnet by substituting a portion of Fe element by Co element. Moreover, in order to develop a new type of permanent magnet having an equivalent or higher Curie point and higher maximum energy product, (BH)max, than the aforementioned Co-containing R-Fe-B system permanent magnet and to improve the temperature characteristics, particularly intrinsic coercive force, iHc, another new type of Co-containing R-Fe-B system permanent magnet has been proposed (Japan Patent Application Laid-Open No. Sho 60-34005), in which the intrinsic coercive force iHc can be enhanced by maintaining an extremely high value (BH)max of more than 25MGOe, by substituting a compositional fraction of R (which mainly represents light-weight rare-earth elements such as Nd or Pr) in the Co-containing R-Fe-B system permanent magnets by at least one element chosen form the element group comprising of heavy-weight rare-earth elements including Dy or Th.

Conventionally, the ferrite magnet has been employed as a magnet used in a vacuum atmosphere with an order of $10^{-3}$ Pa. However, the ferrite magnet has relatively low magnetic properties, which are not high and sufficient enough to employ to the undulator.

There are several important items required for a satisfactory permanent magnet used for ultra-high vacuum atmosphere of lower than $1\times10^{-9}$ Pa; they include (1) excellent magnetic characteristics, (2) no generation nor exhaustion of absorbed or contaminated gas from the magnet surface, and (3) maintaining the high level of vacuum of $1\times10^{-9}$ Pa even after the magnet being installed to the relevant equipment.

Accordingly, the aforementioned R-Fe-B system magnets could have been applied to the undulator used in the ultra-high vacuum because of their high magnetic properties. However, since the gas can easily be adsorbed on or absorbed in the R-Fe-B system magnets, the adsorbed or absorbed gas will be generated or exhausted from the magnet surface layer, causing a difficulty in maintaining the ultra-high vacuum of less than $1\times10^{-9}$ Pa. As a result, the conventional type of R-Fe-B system permanent magnet cannot be used for the ultra-high vacuum atmosphere. In a case when the R-Fe-B system magnet, on which Ni-plating was surface-treated for an anti-corrosion purpose, is utilized in the ultra-high vacuum, the magnet cannot be placed inside the vacuum chamber, rather it is installed outside thereof in order to build the undulator or the similar device. Accordingly, the equipment itself becomes much larger size and the excellent magnetic properties found in the R-Fe-B system magnet cannot effectively be practiced.

Even with other types of R-Fe-B system magnets with which various metals or polymeric resins are coated in order to improve the corrosion resistance of the R-Fe-B system magnets, the generation or exhaustion of adsorbed/absorbed gas is unavoidable, resulting in that the usage of such corrosion-resistant R-Fe-B system magnet is very limited for the ultra-high vacuum atmosphere of, particularly, lower than $1\times10^{-9}$ Pa.

It is, therefore, an object of the present invention to provide a permanent magnet having excellent magnetic characteristics which can be employed for the undulator used in the ultra-high vacuum atmosphere. Furthermore, the permanent magnet according to the present invention has a dense and strongly bonded surface coated layer thereon in order to prevent any gas generation or gas exhaustion out of the magnet surface layers; hence the presently invented magnet has a completely different features from the conventional type of corrosion-resistant R-Fe-B system magnet on which various coated film is applied for anti-corrosion purpose.

DISCLOSURE OF INVENTION

In order to develop a permanent R-Fe-B system magnet having stable and excellent magnetic characteristics and a dense and adherent coated film onto the substrate so that a generation of adsorbed or absorbed gas can be prevented, the present inventors have examined the forming of a thin TiN film on the surface of the permanent magnet. As a result, it was found that the following procedures were promising to achieve the purpose. Namely, (1) the surface of the magnet body is cleaned by the ion sputtering method. (2) A certain film thickness of Ti coated layer is formed on the cleaned surface of the magnet through a thin film forming technique such as the ion plating method. (3) Nitrogen-diffused layer, $TiN_x$ (x=0~1), is formed through a thin film forming technique such as the ion plating method using a mixed gas of Ar gas and $N_2$ gas in such a manner that N concentration in the nitrogen-diffused layer gradually increases toward the surface of the previously formed Ti coated layer. (4) Furthermore, a certain film thickness of TiN coated layer is formed through the ion reaction plating technique in $N_2$ gas atmosphere. It was found that the thus prepared permanent magnet can be used with the undulator in the ultra-high vacuum since the degree of vacuum of less than $1\times10^{-9}$ Pa was achieved after it was placed inside the equipment. Moreover, after further investigation on the TiN thin film forming method on the surface of the permanent magnet, the present inventors had found that the following procedures provided excellent results on enhanced bond strengths between Al film and TiN film. Namely, the procedures are as follows. (1) The surface area of the permanent magnet was cleaned by an ion sputtering technique. (2) A certain thickness of Ti coated film and Al coated film were subsequently formed by the thin film forming method such as the ion plating method. (3) A certain thickness of TiN film was formed through the thin film forming method such as the ion reaction plating in $N_2$ gas. It was found that the TiN film exhibited an excellent bond strength to the Ti under coated film. (4) While forming the TiN film coated on the Al film, a complex film having a formula $Ti_{1-\alpha}Al_{\alpha}N_{\beta}$ (where o<α<1, and 0<β<1) was formed. The composition and the film thickness of $Ti_{1-\alpha}Al_{\alpha}N_{\beta}$ were varied depending upon the magnet substrate temperature, the bias voltage, and the film growth rate. Accordingly, compositional fraction of Ti and N were continuously increasing toward the TiN interface, so that the excellent bond strength between Al coated film and TiN coated film was achieved.

Furthermore, the present inventors have discovered that, while AlN coated layer was formed on Al coated layer after Ti coated layer and Al coated layer were subsequently formed onto the permanent magnet surface, a complex film composed of Al and N having a formula $AlN_x$ was formed at the interface. The composition and film thickness of the complex $AlN_x$ were varied depending upon the temperature of the magnet substrate, the bias voltage, and the film growth rate. It was also found that the N concentration increased gradually toward to the AlN interfacial area, leading to that the adherency between Al coated layer and the AlN film was remarkably enhanced.

Moreover, the present inventors have investigated the method for producing another type of complex compound $Ti_{1-x}Al_xN$ onto the surface layer of the permanent magnet. As a result, a certain film thickness of $Ti_{1-x}Al_xN$ can be formed through the thin film forming method such as the ion reaction plating technique operated in the Nitrogen-containing gas, after Ti coated layer and Al coated layer were subsequently formed. Namely, when $Ti_{1-x}Al_xN$ film was formed onto the Al coated layer, it was found that an intermediate complex compound, $Ti_{1-\alpha}Al_{\alpha}N_{\beta}$ (where 0<α<1, and 0<β<1), was formed at the interfacial area. The composition and the film thickness of the formed $Ti_{1-\alpha}Al_{\alpha}N_{\beta}$ varied depending upon the temperature of the magnet substrate, the bias voltage, the film growth rate, and the composition of $Ti_{1-x}Al_xN$. Compositional fraction of Ti and N appeared to gradually increase toward to the interface with $Ti_{1-x}Al_xN$ layer, resulting in a remarkably improved bond strength between Al coated layer and the $Ti_{1-x}Al_xN$ layer.

The above and many other objectives, features and advantages of the present invention will be fully understood from the ensuing detailed description of the examples of the invention, which description should be read in conjunction with the accompanying drawings.

BEST MODE FOR CARRYING OUT THE INVENTION

Figure 1:
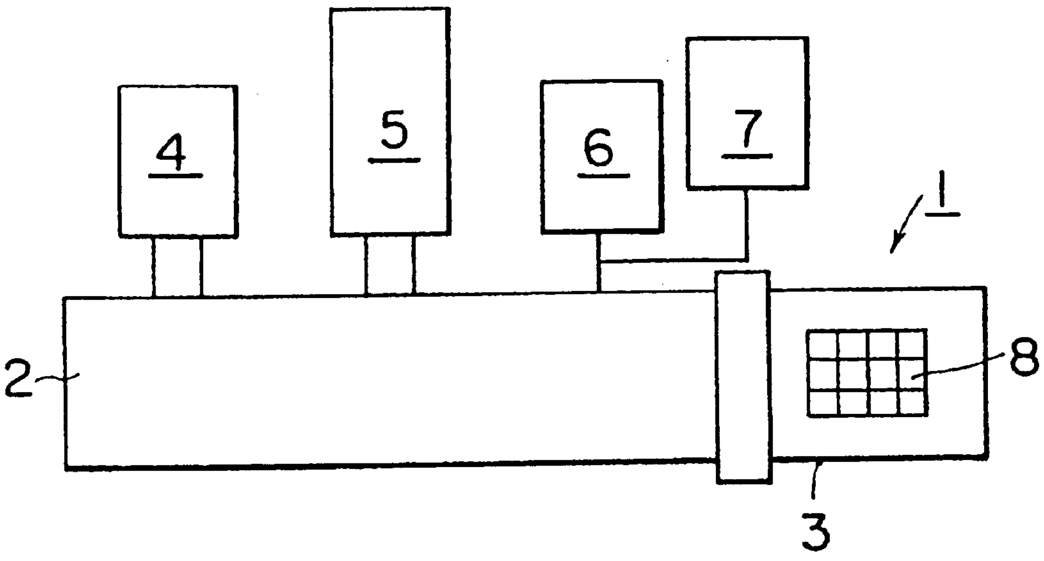
FIG. 1 shows a ultra-high vacuum equipment with which the pressure of vacuum was measured.

An method example for producing a permanent magnet used in the ultra-high vacuum atmosphere will be described in the following sequences, in which said permanent magnet is further characterized by providing TiN layer being coated onto Ti coated layer, which was previously provided on the surface of the R-Fe-B system permanent magnet, through the nitrogen-diffused layer (having a composition of $TiN_x$) in which N concentration increased gradually.

(1) In the arc ion plating equipment, after the vacuum chamber was evacuated below the pressure of vacuum of $1\times10^{-3}$ Pa, the surface area of R-Fe-B system permanent magnet was cleaned by the surface sputter of Ar ion in Ar gas pressure of 5 Pa and at the voltage of −600V.

(2) In the next step, Ti element as a target material was evaporated by the arc ion plating under an Ar gas pressure of 0.2 Pa, and the bias voltage of −80V to produce a Ti coated layer with a film thickness from 0.1 μm to 5.0 μm.

(3) Subsequently, in order to form a certain thickness of the nitrogen-diffused layer with a composition of $TiN_x$ on Ti coated substrate layer, while Ti was kept to be evaporated, the magnet substrate temperature was also kept at 400° C. After introducing a mixed gas of Ar gas and $N_2$ gas under a gas pressure of 1 Pa, the bias voltage of −120V, and arc current of 80A, a nitrogen-diffused layer was formed in such a manner that $N_2$ concentration gradient was continuously increasing toward the TiN coated layer by increasing $N_2$ amount.

(4) In the final step, by the arc ion plating under $N_2$ gas pressure of 1.5 Pa, a certain thickness of TiN coated layer was formed on the nitrogen-diffused layer. According to the present invention, although any prior art methods for forming thin films including the ion plating method or the evaporation method can be employed in order to form the Ti coated layer and nitrogen-diffused layer on the surface of R-Fe-B-system permanent magnet, it is preferable to utilize either ion plating method or ion reaction plating method from standpoints of the density, uniformity and growth rate of the formed film. It is preferable to set the heating temperature of the magnet substrate in a temperature range from 200° C. to 500° C. during the reaction film forming process. If it is lower than 200° C., a sufficient bond strength was not obtained between the reaction film and the magnet substrate; while if it exceeds 500° C., undesired cracking will take place in the films during the cooling stage, causing the peeling off from the magnet substrate surface; so that it is better to set the magnet substrate temperature ranging between 200° C. and 500° C.

In this invention, the main reason for defining the film thickness in a range from 0.1 μm to 3.0 μm for Ti film coated on the magnet surface was due to the facts that (1) if it is less than 0.1 μm, it is not thick enough to maintain the sufficient bond strength, and (2) if it exceeds 3.0 μm, although no adverse effect is recognized with respect to the bond strength, it will cause the cost-up and is not practical.

Similarly, main reasons for controlling the film thickness of nitrogen-diffused layer in a range from 0.05 μm to 2.0 μm being formed on Ti coated layer were due to the facts that (1) if it is less than 0.05 μm, the thickness of the diffusion layer is not thick enough, and on the other hand, (2) if it exceeds 2.0 μm, although no adverse effect on bond strength, it will cause raise in the production cost and hence is not practical.

It is preferable, in this invention, for the nitrogen-diffused layer formed on the Ti coated layer to have a gradually increased $N_2$ concentration toward the TiN coated layer.

Moreover, the main reason for controlling the film thickness of TiN coated layer in a range from 0.5 μm to 10 μm were due to the facts that (1) if it is less than 0.5 μm, sufficient corrosion resistance as well as wear resistance being characterized with TiN cannot be realized, on the other hand, (2) if it exceeds 10 μm, although no problems with respect to its effectiveness, it will cause the raise in the production cost.

In the following, an example procedure for producing the permanent magnet will be described, in which said magnet is characterized by forming TiN coated layer through the Al coated layer which was formed on the Ti coated film, after the Ti film was formed on surface of the R-Fe-B system permanent magnet.

(1) In the arc ion plating equipment, after evacuating the vacuum chamber less than the target degree of vacuum of $1\times10^{-3}$ Pa, the surface area of the R-Fe-B system permanent magnet was cleaned by the surface sputtering Ar ion under Ar gas pressure of 5 Pa and voltage of −600V.

(2) After evaporating the Ti element as a target material under Ar gas pressure of 0.1 Pa and the bias voltage of −50V, Ti coated film with a film thickness ranging from m to 3.01 m was formed on the magnet surface through the arc ion plating method.

(3) After evaporating the target Al under the Ar gas pressure of 0.Pa and the bias voltage of −50V, Al coated film with a film thickness ranging from 1 μm to 5 μm was formed on the Ti coated layer through the arc ion plating method.

(4) Using Ti as a target material, while keeping the magnet substrate temperature at 250° C., a certain film thickness of TiN was formed on the Al coated layer under $N_2$ gas pressure of 1 Pa, the bias voltage of −100V, and arc current of 100A.

According to the present invention, the main reason for controlling the film thickness of Al coated layer in a range of 0.1 μm and 5.0 μm are due to the facts that (1) if it is less than 0.1 μm, Al element is hard to deposited uniformly onto the Ti coated layer and the effective function as an intermediate layer is not achieved, on the other hand, (2) if it exceeds 5.0 μm, although the function as an intermediate layer is not deteriorated, it will cause the raise in production cost.

The main reasons for setting the film thickness of TiN in a range from 0.5 μm to 10 μm are due to the facts that (1) if it is less than 0.5 μm, the sufficient corrosion resistance and wear resistance cannot be achieved, on the other hand, (2) if it exceeds 10 μm, it will cause a raise in the production cost although it does not affect any adverse influence on its functionality.

An example procedure for producing the permanent magnet will be described in the followings, which said magnet is characterized by providing Ti coated layer, and AlN coated layer through the Al coated layer on the Ti coated layer on the R-Fe-B system permanent magnet.

(1) In the arc ion plating equipment, after the vacuum chamber is evacuated at less than the target degree of vacuum of $1\times10^{-3}$ Pa, the surface of the R-Fe-B system permanent magnet was cleaned by surface sputtering Ar ion under the Ar gas pressure of 10 Pa and the voltage of −500V.

(2) Ti as a target material was evaporated under the Ar gas pressure of 0.1 Pa and the bias voltage of −80V in order to form the Ti coated layer with a film thickness ranging from 0.1 μμm to 3.0 μm on the magnet substrate through the arc ion plating method.

(3) Similarly, Al was evaporated under the Ar gas pressure of 0.1 Pa and the bias voltage of −50V in order to form the Al coated layer with a film thickness-ranging from 0.1 μm to 5.0 μm on Ti coated layer by the arc ion plating method.

(4) Using Al as a target material and keeping the magnet substrate temperature at 250° C., AlN film was formed with a certain film thickness onto the Al coated layer under the $N_2$ gas pressure of 1 Pa and the bias voltage of −100V.

The main reasons for the controlling the film thickness of the Al coated layer from 0.1 μm to 5 μm are due to the facts that (1) if it is less than 0.1 μm, Al element is hardly deposited uniformly onto the Ti coated layer and does not perform the sufficient function as the intermediate layer, on the other hand, (2) if it exceeds 5 μm, it will increase the production cost although it does not show any adverse effect.

Moreover, the main reasons for controlling the AlN film thickness in a range from 0.5 μm to 10 μm are due to the facts that (1) if it is less than 0.5 μm, sufficient corrosion resistance as well as wear resistance cannot be achieved, on the other hand, (2) if it exceeds 10 μm, although it does not show any adverse effects on the efficiency, it will increase the production cost.

In the followings, an example procedure for producing the permanent magnet will be described, in which said permanent magnet is characterized by providing $Ti_{1-x}Al_xN$ (where 0.03<x<0.70) coated layer through the Al coated layer being previously formed on the Ti coated layer, after forming Ti coated layer onto the surface of R-Fe-B system permanent magnet.

(1) In the arc ion plating equipment, the vacuum chamber was evacuated below the pressure of vacuum of $1\times10^{-3}$ Pa, the surface area of the R-Fe-B system permanent magnet was cleaned by surface sputtering Ar ion under Ar gas pressure of 10 Pa and the voltage of −500V.

(2) Ti as a target material was evaporated under Ar gas pressure of 0.1 Pa and the bias voltage of −80V in order to form the Ti coated layer with a film thickness ranging from 0.1 μm to 3.0 μm onto the magnet substrate by the arc ion plating method.

(3) Al as the next target material was evaporated under the Ar gas pressure of 0.1 Pa and the bias voltage of −50V in order to form the Al coated layer with film thickness ranging from 0.1 μm to 5 μm onto Ti coated layer by the arc ion plating technique.

(4) Subsequently, using an alloy $Ti_{1-x}Al_x$ (where 0.03<x<0.80) as a target material and keeping the magnet substrate temperature at 250° C., a certain film thickness of $Ti_{1-x}Al_xN$ coated film was formed onto the Al coated layer under the $N_2$ gas pressure of 3 Pa and the bias voltage of −120V.

According to the present invention, the main reasons for defining the thickness of Al coated layer onto the Ti coated layer in a range from 0.1 μm to 5 μm are due to the facts that (1) if it is less than 0.1 m Al is hardly deposited uniformly on Ti coated layer and does not function as an intermediate layer, and (2) if it exceeds 5 μm, it will cause a raise in the production cost, although it does not affect any adverse effect on the efficient functionality.

Moreover, the main reasons for defining the film thickness of $Ti_{1-x}Al_xN$ (where 0.03<x<0.70) coated layer in a range from 0.5 μm to 10 μm are due to the facts that (1) if it is less than 0.5 μm, sufficient corrosion resistance and wear resistance cannot be achieved, and that (2) if it exceeds 10 μm, although no problem with respect to the efficiency, it will cause the raise in production cost. Furthermore, in the composition $Ti_{1-x}Al_xN$, if x is less than 0.03, the sufficient properties of the corrosion resistance as well as wear resistance cannot be obtained; while if it exceeds 0.70, no remarkable improvement in properties were recognized and it is hard to obtain the uniformly distributed composition.

The rare-earth element, R, used in the permanent magnet of the present invention has a composition ranging from 10 atomic % to 30 atomic %. It is preferable to choose at least one element from a element group comprising of Nd, Pr, Dy, Ho, and Tb, and/or at least one element from a element group consisted of La, Ce, Sm, Gd, Er, Eu, Tm, Yb, Lu, and Y. Normally it would be good enough if one element R was selected. However, it would be more practical and efficient if a mixture of more than two elements (such as mishmetal or didymium) were preferably chosen. Furthermore, it is not necessary to select the pure grade rare-earth element, rather any element(s) containing unavoidable impurity or impurities can be selected.

The R element is an essential element for the permanent magnet. If it is contained less than 10 atomic %, since the crystalline structure of the R element is a cubic structure, which is identical to that of α-Fe (ferrite), then excellent magnetic properties, particularly high intrinsic coercive force cannot be obtained. On the other hand, if it exceeds 30 atomic %, a R-rich non-magnetic phase will become to be a dominant phase, causing a reduction in the residual flux density, Br, so that the permanent magnet with excellent magnetic characteristics cannot be produced. Accordingly, it is preferable to control the R contents in a range from 10 atomic % to 30 atomic %.

Boron, B, is also an essential element for the permanent magnet. If it is contained less than 2 atomic %, the rhombohedral structure will become to be a parent phase, resulting in that high intrinsic coercive force, iHc, cannot be expected. On the other hand, if it exceeds 28 atomic %, the B-rich non-magnetic phase will be a dominant phase, resulting in a reduction in the residual flux density, Br, so that the permanent magnet with excellent magnetic properties cannot be produced. Accordingly, it is preferable to control the B contents in a range from 2 atomic % to 28 atomic %.

It is obvious that Fe element is the essential element for the permanent magnet. If it is contained less than 65 atomic %, the residual flux density, Br, will be reduced; on the other hand, if it exceeds 80 atomic %, high value of intrinsic coercive force, iHc, cannot be expected. Hence, it is preferable to control Fe contents in a range between 65 atomic % and 80 atomic %. Although a substitution of a fraction of Fe with Co will improve the temperature characteristics without deteriorating other magnetic properties; if Co is replaced to more than 20% of Fe element, the magnetic property will be adversely influenced. If amount of replacing Co is within a range of 5 atomic % to 15 atomic % of the total amount of Fe and Co elements, the residual flux density, Br, will increase, compared to the magnet without any replaced Co element, so that a range between 5 atomic % and 15 atomic % is preferable in order to obtain the high residual flux density.

Unavoidable impurity (or impurities) will be allowed to the aforementioned three essential elements, R, B, and Fe. For example, A portion of B element can be replaced by at least one element from the element group comprising of C (less than 4.0 weight %), P (less than 2.0 wt %), S (less than 2.0 wt %) and Cu (less than 2.0 wt %) or any elements if the total percentage is less than 2.0 wt %. It is possible to improve the productivity and the cost-down for fabricating the permanent magnets if the above mentioned substitution is conducted.

Furthermore, at least any one of element selected from the element group consisted of Al, Ti, V, Cr, Mn, Bi, Nb, Ta, Mo, W, Sb, Ge, Sn, Zr, Ni, Si, Zn, and Hf can be added to the R-Fe-B system permanent magnet in order to improve the intrinsic coercive force, the rectangularity of demagnetization curve, a productivity, and cost-performance. The upper limit of the addition should be carefully selected, since the residual flux density Br is required to show at least more than 9 kG in order to have the (BH)max being higher than 20MGOe.

Moreover, the permanent magnet of the present invention is characterized by the fact that a parent phase of the magnet is a tetragonal crystalline structure having an average grain size ranging from 1 μm to 80 μm, and that the magnet contains 1% to 50% (in the volumetric ratio) of non-magnetic phase (excluding oxide phase(s)).

The permanent magnet, according to the present invention, shows the following magnetic characteristics; namely, the intrinsic coercive force, iHc≧1 kOe, the residual flux density, Br>4 kG, the maximum energy product, (BH) max≧10 MGOe, while the maximum value can reach more than 25 MGOe.

Example 1—1

A prior art of cast ingot was pulverized, followed by press-forming, sintering and heat-treating the product to prepare a sample magnet having a composition of 15 Nd-1Dy-77Fe-7B with a dimension of 12 mm in diameter and 2 mm in thickness. The sample magnet was placed in the vacuum chamber to evacuate less than $1\times10^{-3}$ Pa. After the surface of the sample magnet was cleaned under the surface Ar ion sputter method under Ar gas pressure of 5 Pa and the voltage of −600V for 20 minutes, Ti element as a target element was then plated with a film thickness of 0.5 μm on the surface of the sample magnet under following conditions; Ar gas pressure: 0.2 Pa, bias voltage: −80V, arc current: 120A, and temperature of the magnet substrate: 380° C.

After the magnet substrate was heated again at 380° C. and a mixed gas ($Ar:N_2$=9:1) with a pressure of 1 Pa was introduced. While the mixed ratio of Ar and $N_2$ gas was continuously changed from the initial ratio of 9:1 to 7:3→5:5→3:7→0:10, a nitrogen-diffused layer (with a composition $TiN_x$) with a film thickness of 0.2 μm was formed on the Ti coated layer under the bias voltage of −120V and arc current of 80A for 30 minutes.

Furthermore, the TiN coated layer with a film thickness of 5 μm was formed on the aforementioned nitrogen-diffused layer through the ion plating technique under the following conditions; $N_2$ gas pressure: 1.5 Pa, bias voltage: −100V, arc current: 120A.

Figure 2:
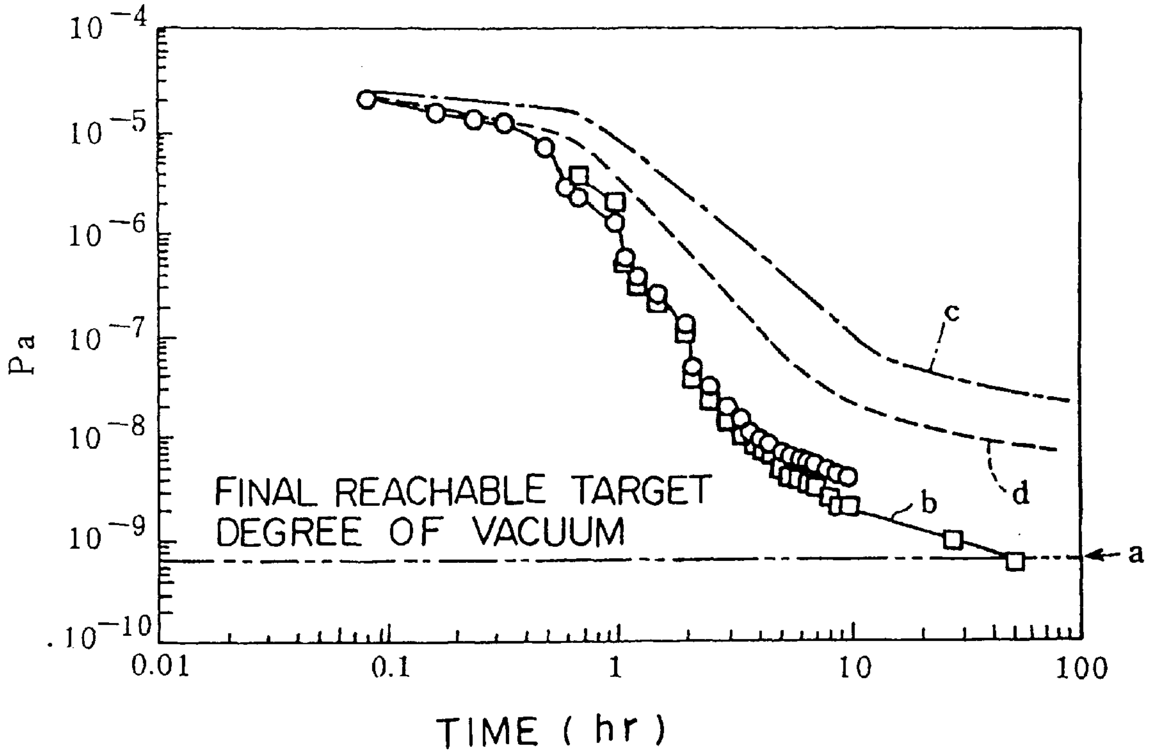
FIGS. 2 through 5 show the progressive changes in degree of vacuum for differently surface-treated magnets, indicating the time required to reach the pressure of vacuum.

After the chamber cooling, magnetic properties of the thus prepared permanent magnet having TiN layer were measured. The obtained results are listed in Table 1. The time required for the reaching the target degree of vacuum, using the above prepared sample magnet, was also measured by the ultra-high vacuum equipment, as seen in FIG. 1. FIG. 2 shows the results on the progressive changes in the degree of vacuum.

In the ultra-high vacuum equipment as seen in FIG. 1, there are an ultra-high vacuum chamber 1, a main body of cylindrical tube 2, in which a Ti getter pump 4, an ion pump 5, BA gage 6 and an extractor gage 7 are placed. A sample chamber 3 is provided at one end portion of the main body 2.

Without placing the sample magnet 8 into the vacuum chamber 3, the chamber was baked at a temperature of 150° C.~200° C. for 48 hours while evacuating the chamber with operating the Ti getter pump 4 and the ion pump 5. After the temperature inside of the main body 2 was cooled down lower than 70° C., the final reachable target degree of vacuum was measured by operating the BA gage 6 and the extractor gage 7. It was recorded that the finally reached target degree of vacuum was $7\times10^{-10}$ Pa, as seen with a line "a" in FIG. 2.

Sixty (60) pieces of sample magnets 8 with dimension of 8 mm high×8 mm wide×50 mm long were placed inside the sample chamber 3. After baking the chamber at a temperature of 150° C.–200° C. for 48 hours by operating the Ti getter pump 4 and the ion pump 5. After the temperature of the main body 2 was cooled down below 70° C., the degree of vacuum was progressively measured by operating the BA gage 6 and the extractor gage 7. The time elapsed until the final target degree of vacuum was shown with the curve “b” in FIG. 2, where ○ marks represent data point measured by the BA gage and □ marks indicate data points obtained with the extractor gage.

Comparison 1-1

Magnetic properties of the sample magnet having an identical composition as the previous Example 1—1 are also listed in Table 1. After sample magnets with identical dimensions and quantity as the Example 1—1 were cleaned under the same conditions conducted for the Example 1—1, the target degree of vacuum was measured with the ultra-high vacuum chamber of FIG. 1 under the same conditions performed for the Example 1—1. The result is shown with the curve “c” in FIG. 2.

TABLE 1

| | | magnetic properties | | |
|---|---|---|---|---|
| | | Br(kG) | iHc(kOe) | (BH)max(MGOe) |
| Example 1-1 | this invension | 11.6 | 16.8 | 32.8 |
| Comparison 1-1 | un-treated magnet | 11.7 | 16.6 | 33.2 |
| Comparison 1-2 | Ni-plated magnet | 11.5 | 16.4 | 32.6 |

Comparison 1-2

Same number of sample magnets with identical dimensions and compositions as the Example 1—1 were used. After the surface area of the sample magnets were cleaned under the same conditions done for the Example 1-1, Ni film with a thickness of 20 μm was formed by a conventional plating method. The magnetic properties of the Ni-plated magnets were evaluated and listed in Table 1. The surface area of the Ni-plated magnets were cleaned, followed by measurement on the pressure of vacuum using the ultra-high vacuum chamber of FIG. 1 under the same conditions performed for the Example 1—1. The data is shown with the curve “d” in FIG. 2.

The R-Fe-B system permanent magnet, according to the present invention, being provided with the TiN layer onto the Ti coated layer through the nitrogen-diffused layer (with a composition of $TiN_x$) with continuously increased N concentration has demonstrated clearly that no gas was generated out of the magnet surface, so that the vacuum of $1\times10^{-9}$ Pa was achieved. On the other hand, with un-treated magnet or Ni-plated magnet, it was found that the gas generation cannot be prevented. So that the target degree of vacuum was not achieved.

Example 2-1

The cast ingot of the prior art was pulverized, followed by press-forming, sintering and heat-treating to produce a sample magnet of 16Nd-1Dy-76Fe-7 B with dimensions of 12 mm in diameter and 2 mm in thickness. The measured magnetic properties are listed in Table 2.

The vacuum chamber was evacuated under the level of $1\times10^{-3}$ Pa. The surface area of the sample magnet was cleaned by the surface Ar ion sputter under the Ar gas pressure of 10 Pa and the voltage of −500V for 20 minutes. Keeping the Ar gas pressure at 0.1 Pa, the bias voltage at −80V, arc current at 100 A and the temperature of the magnet substrate at 280° C., the Ti coated layer with a film thickness of 1 μm was formed onto the magnet surface by using Ti as a target material through the arc ion plating technique.

Furthermore, under the conditions such as Ar gas pressure of 0.1 Pa, bias voltage of −50V, arc current of 50A, and the magnet substrate temperature at 250° C., the Al coated layer with a film thickness of 2 μm was formed onto the Ti coated layer by using metallic Al as a target material through the arc ion plating method.

Under the magnet substrate temperature of 350° C., bias voltage of −100V, arc current of 100A, $N_2$ gas pressure of 1 PA, the TiN coated layer with a film thickness of 2 μm was formed onto the Al coated layer through the arc ion plating by using metallic Ti as a target material.

Figure 3:
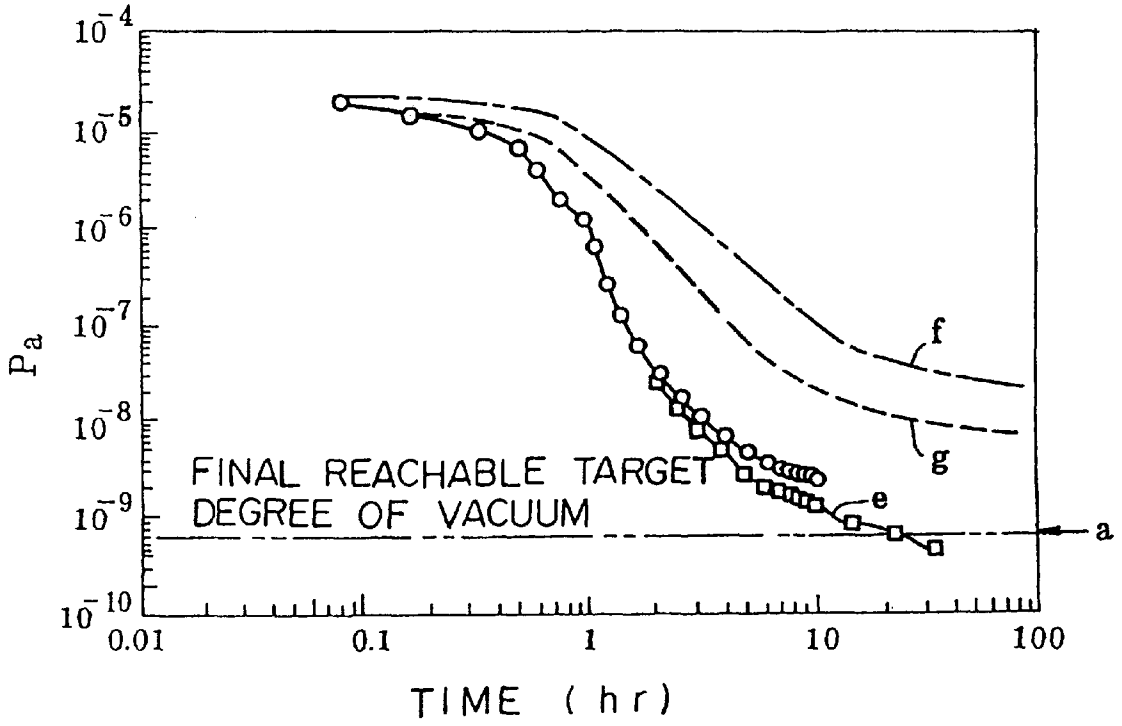

After the chamber cooling, the magnetic properties of the permanent magnet with TiN coated film were examined. Results are shown in Table 2. The pressure of vacuum of the permanent magnet was measured with the ultra-high vacuum equipment, as seen in FIG. 1. The obtained results are seen in FIG. 3.

TABLE 2

| | | magnetic properties | | |
|---|---|---|---|---|
| | | Br(kG) | iHc(kOe) | (BH)max(MGOe) |
| Example 2-1 | this invension | 11.2 | 15.9 | 30.1 |
| Comparison 2-1 | un-treated magnet | 11.7 | 15.9 | 30.1 |
| Comparison 2-2 | Ni-plated magnet | 11.1 | 15.9 | 30.1 |

The measuring procedures were exactly same as those performed for the Example 1—1. The final reachable degree of vacuum of the used equipment was $7\times10^{-10}$ Pa, as indicated with the line “a” in FIG. 3. After sixty (60) pieces of sample magnets 8 with dimensions of 8 mm high×8 mm wide×50 mm long were placed inside the sample chamber 3, the time required until the final degree of vacuum elapsed was monitored, as seen in curve “e” in FIG. 3. Data points marked by 0 symbols represent results obtained by the BA gage; while □ marks indicate data points obtained with the extractor gage.

Comparison 2-1

The magnetic characteristics of the sample magnet having identical composition as the Example 2-1, but without Ti film, Al coated layer, and TiN film layer are listed in Table 2. Identical number of sample magnets with identical dimensions as the Example 2-1 were cleaned under the same conditions conducted for the Example 2-1. The final reachable target degree of vacuum was measured under the same conditions done for the Example 2-1 by using the ultra-high vacuum equipment of FIG. 1. Results are shown with the curve “f” in FIG. 3.

Comparison 2-2

After the surface area of identical number, identical composition and size to those used for the Example 2-1 was cleaned under the same conditions employed for the Example 2-1, the Ni film with a film thickness of 20 μm was plated through the conventional plating technique. The magnetic properties of the thus prepared Ni-plated magnet were evaluated and results are listed in Table 2. Subsequently, after the Ni-plated surface was cleaned, the final reachable degree of vacuum was measured under the same conditions done for the Example 2-1 by using the ultra-high vacuum equipment of FIG. 1. The results are shown with the curve “g” in FIG. 3.

It was found that the R-Fe-B system permanent magnet, according to the present invention, being provided with TiN coated layer through the Al coated layer which was previously formed on the Ti coated layer has demonstrated no gas generation out of the magnet surfaces and a satisfactory capability of reaching the final pressure of vacuum of $1\times10^{-9}$ Pa. On the other hand, the magnet without any treatment or those with Ni-plated layers thereon showed the gas generation, so that the final reachable target degree of vacuum was not achieved.

Example 3-1

The cast ingot of the prior art was pulverized, followed by press-forming, sintering and heat-treating in order to produce the sample magnet having a composition of 16Nd-1Dy-75Fe-8B and dimensions of 12 mm in diameter and 2 mm in thickness. After the sample magnet was placed inside the vacuum chamber, it was evacuated below the degree of vacuum of $1\times10^{-3}$ Pa. After the surface area of the magnet was cleaned by the surface Ar ion sputter method under the conditions of Ar gas pressure of 5 Pa, voltage of −600V for 20 minutes, the Ti coated layer with a film thickness of 1 $\mu$m was formed on the magnet surface through the arc ion plating method using metallic Ti as a target material under the following conditions; namely, Ar gas pressure: 0.2 Pa, bias voltage: −80V, the magnet substrate temperature: 250° C.

Subsequently, keeping the Ar gas pressure at 0.1 Pa, bias voltage at −50V and the magnet substrate temperature at 250° C., the Al coated layer with a film thickness of 2 $\mu$m was formed onto the Ti coated layer through the arc ion plating technique using metallic Al as a target material. In the next stage, the AlN coated layer with a film thickness of 2 $\mu$m was formed on Al coated layer by the arc ion plating method using metallic Ti as a target material under the conditions of magnet substrate temperature of 350° C., the bias voltage of −100V, and $N_2$ gas pressure of 1 Pa.

Figure 4:
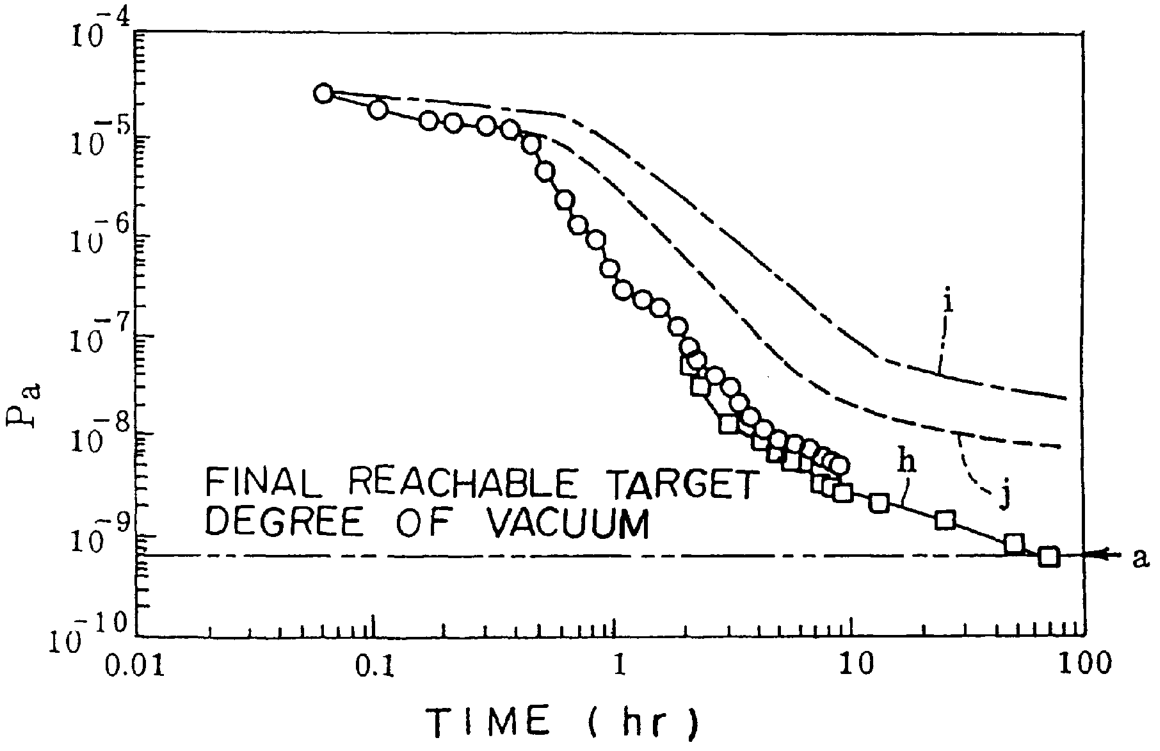

After the chamber cooling, the magnetic properties of the thus prepared magnet was measured. The results are listed in Table 3. The reachable pressure of vacuum was evaluated using the ultra-high vacuum equipment of FIG. 1. The obtained results are shown in FIG. 4.

The measuring procedures for the Example 3-1 were exactly same as those done for the Example 1-1. It was found that the final reachable degree of vacuum was $7\times10^{-10}$ Pa, as seen with the line "a" in FIG. 4. After sixty pieces of sample magnets 8 with dimensions of 8 mm high×8 mm wide×50 mm long were placed inside the sample chamber 3, the time required for the final reachable degree of vacuum was monitored, as seen the curve "h" in FIG. 4, where ○ marks represent data points obtained by the BA gage and L marks indicate data points measured by the extractor gage.

Comparison 3-1

The magnetic properties of sample magnet having identical composition as those used for the Example 3-1 but without any external films of Ti coated layer, Al coated layer, and AlN coated layer are also listed in Table 3. After the surface area of identical numbers of sample magnets with identical dimensions to those used in the Example 3-1 was cleaned under the same procedures conducted for the Example 1-1, the final reachable pressure of vacuum was measured under the same conditions performed for the Example 3-1 using the ultra-high vacuum equipment of FIG. 1. The result is shown with the curve "i" in FIG. 4.

TABLE 3

| | | magnetic properties | | |
|---|---|---|---|---|
| | | Br(kG) | iHc(kOe) | (BH)max(MGOe) |
| Example 3-1 | this invension | 11.3 | 16.0 | 30.1 |
| Comparison 3-1 | un-treated magnet | 11.3 | 16.0 | 30.1 |
| Comparison 3-2 | Ni-plated magnet | 11.2 | 16.0 | 30.0 |

Comparison 3-2

After surface area of same numbers of sample magnets with identical composition and dimensions to those used for the Example 3-1 was cleaned under the same procedures done for the Example 3-1, Ni-plated film with a film thickness of 20 $\mu$m was formed through the conventional plating method. The magnetic properties of the Ni-plated sample magnet are also listed in Table 3. Furthermore, after the surface layer of the Ni-plated magnet was cleaned, the final reachable pressure of vacuum was measured under the same conditions as those conducted for the Example 1-1 using the ultra-high vacuum equipment of FIG. 1. The result is shown with the curve "j" in FIG. 4.

The R-Fe-B system permanent magnet, according to the present invention, being provided with TiN coated film and subsequently formed AlN film coated on Al film which was previously coated on said Ti film has clearly demonstrated that no gas was generated from the magnet surface, so that the degree of vacuum of $1\times10^{-9}$ Pa or less can be achieved. However, with sample magnets with either untreated condition or Ni-plated film, gas generation was noticed, so that the target degree of vacuum cannot be achieved.

Example 4-1

The cast ingot of the prior art was pulverized, followed by press-forming, sintering and heat-treating in order to produce the sample magnet with a composition of 16Nd-76Fe-8B with dimensions of 12 mm in diameter and 2 mm in thickness. After the magnet was placed inside the vacuum chamber, the chamber was evacuated below the level of $1\times10^{-3}$ Pa. After the surface area of the magnet was cleaned under the surface sputter method under the conditions of the Ar gas pressure of 5 Pa and voltage of −600V for 20 minutes, the Ti coated layer with a film thickness of 1 $\mu$m was formed by the arc ion plating method using metallic Ti as a target material under the conditions of Ar gas pressure of 0.2 Pa, bias voltage of −80V, and the magnet substrate temperature at 250° C.

Subsequently, the Al coated layer with a film thickness of 2 $\mu$m was formed onto the Ti coated layer through the arc ion plating technique by using metallic Al as a target material under the conditions of the Ar gas pressure of 0.1 Pa, the bias voltage of −50V and the magnet substrate temperature of 250° C.

Keeping the magnet substrate temperature at 320° C., bias voltage of −120V and the $N_2$ gas pressure of 3 Pa, the $Ti_{1-x}Al_xN$ film with a film thickness of 3 $\mu$m was formed onto the Al coated layer through the arc ion plating technique by using an alloy $Ti_{0.4}Al_{0.6}$ as a target material. It was found that the composition of the obtained complex compound was $Ti_{0.45}Al_{0.55}N$. After the chamber cooling, the magnetic properties of the magnet was evaluated. Results are listed in Table 4. The final reachable pressure of vacuum was examined using ultra-high vacuum equipment of FIG. 1. The obtained results are shown in FIG. 5.

The same procedures as for the Example 1-1 were conducted for measuring the final reachable degree of vacuum.

Figure 5:
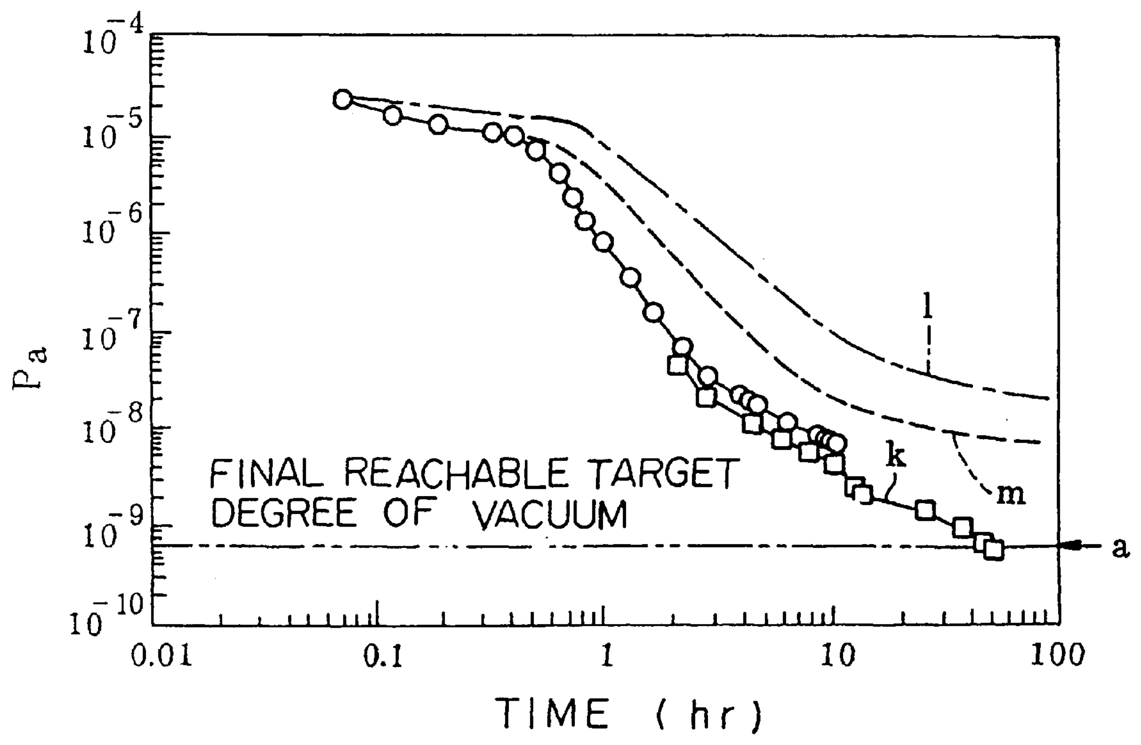

It was found that the finally reached degree of vacuum was $7\times10^{-10}$ Pa, as seen with the line "a" in FIG. 5. After sixty pieces of sample magnets 8 with dimensions of 8 m high×8 mm wide×50 mm long were placed into the sample chamber 3, the time required in order to reach the final pressure of vacuum was continuously monitored. The curve "k" in FIG. 5 shows the results, whereby 0 marks indicate data point obtained by the BA gage; while data point marked with ○ symbols represent those obtained by the extractor gage.

Comparison 4-1

The magnetic properties of the sample magnet having the identical composition as the Example 4-1, but without any coated films of Ti, Al and $Ti_{1-x}Al_xN$ layers, are listed in Table 4. Similarly as done for the Example 4-1, the surface area of the sample magnets were cleaned, and the finally reachable degree of vacuum was monitored in the ultra-high vacuum equipment under the same conditions conducted for the Example 4-1. The line "1" in FIG. 5 shows the results.

Comparison 4-2

Sample magnets having identical composition, dimensions and quality as those for the Example 4-1 were subjected to the surface cleaning under the same conditions performed for the Example 4-1. Using the conventional plating method, the Ni film with a film thickness of 20 μm was formed. The magnetic properties of the Ni-plated magnets are also listed in Table 4. Subsequently, after the Ni-plated surface was cleaned, the finally reachable degree of vacuum was measured under the same conditions performed for the Example 4-1. The curve "m" indicates the results.

TABLE 4

| | | magnetic properties | | |
|---|---|---|---|---|
| | | Br(kG) | iHc(kOe) | (BH)max(MGOe) |
| Example 4-1 | this invension | 11.0 | 16.0 | 30.0 |
| Comparison 4-1 | un-treated magnet | 11.0 | 16.0 | 30.0 |
| Comparison 4-2 | Ni-platedmagnet | 11.0 | 16.0 | 30.0 |

The R-Fe-B system permanent magnet, according to the present invention, having an external layer of $Ti_{1-x}Al_xN$ coated layer formed on the Al coated layer which was previously formed onto the Ti coated layer has demonstrated that there was no gas generation, so that the final reachable degree of vacuum of $1\times10^{-9}$ Pa was achieved. On the other hand, with magnets without any further treatments or those being provided with the Ni-plated layer, gas generation was found, causing the difficulty to reach the target degree of vacuum.

INDUSTRIAL APPLICABILITY

According to the present invention, by subsequent procedures of (1) cleaning the surface of R-Fe-B system permanent magnet by the surface sputter method, (2) forming Ti coated film as a under coat by the thin film forming technique such as the ion plating method, and (3) forming either TiN film layer, AlN film layer or $Ti_{1-x}Al_xN$ as an external layer and/or Al layer or $TIN_x$ layer as an intermediate layer by the ion reaction plating technique in $N_2$-containing gas, the surface of the R-Fe-B system permanent magnet is coated with a dense and adherent film to prevent the gas generation, so that it is applicable to the undulator used in the ultra-high vacuum atmosphere which said undulator is required to exhibit excellent magnetic characteristics.

While this invention has been described with respect to preferred examples, it should be understood that the invention is not limited to that precise examples; rather many modifications and variations would present themselves to those of skill in the art without departing from the scope and spirit of this invention, as defined in the appended claims.

We claim:

1. A magnet made of an R-Fe-B system alloy usable for ultra-high vacuum with a layer consisting of Ti as an undercoat coated on a surface layer of said magnet, either a TiN layer, an AlN layer or a $Ti_{1-x}Al_xN$ layer (where x: 0.03–0.70) as an external layer, and an Al layer inserted as an intermediate layer between the Ti undercoat layer and the external layer.

2. The magnet for ultra-high vacuum according to claim 1, wherein the Ti undercoat layer has a thickness of 0.1 μm to 3.0 μm.

3. The magnet for ultra-high vacuum according to claim 1, wherein the the external layer consists of TiN and has a thickness of 0.5 μm to 10 μm.

4. The magnet for ultra-high vacuum according to claim 1, wherein the external layer consists of AlN and has a thickness of 0.5 μm to 10 μm.

5. The magnet for ultra-high vacuum according to claim 1, wherein the external layer consists of $Ti_{1-x}AlN$ (where x:0.03–0.70) and has a thickness of 0.5 μm to 10 μm.

6. The magnet for ultra-high vacuum according to claim 1, wherein the Al intermediate layer has a thickness of 0.1 μm to 5.0 μm.

7. A production process for a magnet usable for ultra-high vacuum, comprising the sequential steps of:

cleaning a surface layer of an R-Fe-B system magnet whose main phase consists of a tetragonal phase;

forming an undercoat layer consisting of Ti on the cleaned surface of valid R-Fe-B system magnet using a thin film forming method;

forming an Al layer on the Ti undercoat layer using a thin film forming method; and forming either one of a TiN layer, an AlN layer or a $Ti_{1-x}Al_xN$ (where x is 0.03 to 0.70) layer as an external layer using a thin film forming method.

8. The production process for the magnet according to claim 7, wherein said thin film forming method is either an ion plating or an evaporation method.

9. The production process for the magnet according to claim 7, wherein the the Ti undercoat layer is formed to a thickness between 0.1 μm and 3.0 μm.

10. The production process for the magnet according to claim 7, wherein the external layer is formed of TIN to a thickness of 0.5 μm to 10 μm.

11. The production process for the magnet according to claim 7, wherein the external layer is formed of AlN to a thickness of 0.5 μm 10 μm.

12. The production process for the magnet according to claim 7, wherein the the external layer is formed of $Ti_{1-x}Al_xN$ (where x:0.03–0.70) to a thickness of 0.5 μm to 10 μm.

13. The production process for the magnet according to claim 7, wherein the the intermediate Al layer is formed to a thickness of 0.1 μm to 5 μm.

* * * * *

UNITED STATES PATENT AND TRADEMARK OFFICE

CERTIFICATE OF CORRECTION

PATENT NO. : 6,080,498

DATED : June 27, 2000

INVENTOR(S) : Fumiaki KIKUI et al.

It is certified that error appears in the above-identified patent and that said Letters Patent are hereby corrected as shown below: Title page, item

[75] Inventors: Fumiaki Kikui, Osaka; Masako Ikegami, Hyogo; Kohshi Yosimura, Osaka, all of Japan

Signed and Sealed this

Third Day of April, 2001

Attest:

NICHOLAS P. GODICI

*Attesting Officer* *Acting Director of the United States Patent and Trademark Office*